United States Patent
Park et al.

(10) Patent No.: US 6,734,100 B2
(45) Date of Patent: May 11, 2004

(54) METHOD OF FORMING RUTHENIUM THIN FILM USING PLASMA ENHANCED PROCESS

(75) Inventors: Kyung Woong Park, Seoul (KR); Jung Hwan Choi, Seoul (KR); Young Ki Han, Seoul (KR)

(73) Assignee: Jusung Engineering Co., Ltd., Kyunggio-Do (KR)

( * ) Notice: Subject to any disclaimer, the term of this patent is extended or adjusted under 35 U.S.C. 154(b) by 0 days.

(21) Appl. No.: 10/326,769

(22) Filed: Dec. 20, 2002

(65) Prior Publication Data

US 2003/0119315 A1 Jun. 26, 2003

(30) Foreign Application Priority Data

Dec. 20, 2001 (KR) .................. 10-2001-0081679

(51) Int. Cl.$^7$ .............................. H01L 21/44
(52) U.S. Cl. .............. 438/686; 438/680; 438/687; 438/688; 438/396; 438/240; 438/238; 427/250; 427/255.31; 427/255.7; 257/306; 257/310
(58) Field of Search ................. 438/680, 686, 438/687, 688, 238, 240, 396; 427/250, 255.31, 255.7, 99; 257/306, 310

(56) References Cited

U.S. PATENT DOCUMENTS 6,316,064 B1    11/2001  Onozawa et al. ........... 427/585
6,461,961 B1    10/2002  Sano et al. .................. 438/686
6,475,854 B2 *  11/2002  Narwankur et al. ........ 438/238
6,479,100 B2 *  11/2002  Jin et al. ............... 427/255.31

* cited by examiner

Primary Examiner—David Nelms
Assistant Examiner—Renee R Berry
(74) Attorney, Agent, or Firm—Marger Johnson & McCollom, P.C.

(57) ABSTRACT

A conventional method of forming a ruthenium thin film has a problem that conditions for improving a surface morphology are contrary to those for improving a step coverage, with respect to an oxygen fraction, a pressure, a temperature, etc. Accordingly, it is difficult to obtain a thin film having the improved properties in both the surface morphology and the step coverage. This invention provides three methods for improving both the surface morphology and the step coverage. As one method of forming the ruthenium thin film, a ruthenium seed layer is first formed using a PECVD process and then a ruthenium thin film is deposited using a thermal CVD process. As another method, a first ruthenium thin film is deposited using a thermal CVD process and then a second ruthenium thin film is formed on the first ruthenium thin film using a PECVD process. As further another method, a ruthenium thin film is deposited using a thermal CVD process and then a surface of the ruthenium thin film is processed using an oxygen containing plasma. According to these methods, both the surface morphology and the step coverage can be improved.

20 Claims, 5 Drawing Sheets

METHOD OF FORMING RUTHENIUM THIN FILM USING PLASMA ENHANCED PROCESS

BACKGROUND OF THE INVENTION

1. Field of the Invention

The present invention relates to a method of forming a ruthenium thin film, and more particularly, to a method of forming a ruthenium thin film using a plasma enhanced process.

2. Description of the Related Art

A dielectric thin film of a conventional NO or ONO structure has a limitation if it is to be applied to a next-generation memory device. Therefore, many researches on high dielectric thin films have been actively made and result in the appearance of $Ta_2O_5$ layer, lead zirconate titanate (PZT) layer, barium strontium titanate (BZT) layer, etc. Accordingly, capacitor's electrode materials adapted to the corresponding high dielectric thin films have been also researched. Among them, one is a ruthenium (Ru) thin film. Typically, the ruthenium thin film is deposited using a metal-organic chemical vapor deposition (MOCVD) process, which uses a tris(2,4-octanedionato)Ru (hereinafter, referred to as Ru(OD)3) as a ruthenium precursor. At this time, it is very difficult to secure processing conditions capable of simultaneously satisfying an electric conductivity, a smooth surface morphology, an excellent step coverage, etc.

Generally, the Ru(OD)3 is kept in a state that it is dissolved in methanol, and it is evaporated and supplied into a reaction chamber together with an oxygen gas and an argon gas to thereby deposit the ruthenium thin film on a semiconductor substrate-previously mounted within the reaction chamber. At this time, with respect to an oxygen fraction, a pressure, a temperature, etc., conditions for improving the surface morphology are contrary to those for improving the step coverage.

FIGS. 1 and 2 are a scanning electron microscope (SEM) photograph and an atomic force microscope (AFM) photograph of a surface of the ruthenium thin film deposited using a thermal chemical vapor deposition (CVD) process under the condition for improving the surface morphology, respectively. To the satisfaction, as can be seen from FIGS. 1 and 2, the surface morphology (rms) is approximately 1.9 nm. Under this condition, however, the step coverage is not good. Meanwhile, if the oxygen fraction is increased, the step coverage is improved, as shown in FIG. 3. However, the surface morphology is rapidly increased to approximately 6.9 nm. Therefore, in case where the ruthenium thin film is used as a bottom electrode of the dielectric thin film, a phenomenon of local electric-field concentration may occur, so that an electric property of the dielectric thin film is degraded.

As described above, according to the conventional method of forming the ruthenium thin film, since the conditions for improving the surface morphology are contrary to those for improving the step coverage, it is difficult to obtain the thin film having the improved properties in both the surface morphology and the step coverage.

SUMMARY OF THE INVENTION

Therefore, the present invention has been devised to solve the above problems, and it is an object of the present invention to provide a method of forming a ruthenium thin film having improved properties in both a surface morphology and a step coverage.

In accordance with an embodiment of the present invention, there is provided a method of forming a ruthenium thin film, which comprises the steps of: a) forming a ruthenium seed layer on a semiconductor substrate using a PECVD process; and b) forming a ruthenium thin film on the ruthenium seed layer using a thermal CVD process.

In accordance with another embodiment of the present invention, there is provided a method of forming a ruthenium thin film, which comprises the steps of: a) forming a ruthenium thin film on a semiconductor substrate using a thermal CVD process; and b) processing a surface of the ruthenium thin film using an oxygen containing plasma.

In accordance with further another embodiment of the present invention, there is provided a method of forming a ruthenium thin film, which comprises the steps of: a) forming a first ruthenium thin film on a semiconductor substrate using a thermal CVD process; and b) forming a second ruthenium thin film on the first ruthenium thin film using a PECVD process.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Now, preferred embodiments of the present invention will be described in detail with reference to the annexed drawings.

[Embodiment 1]

A significant characteristic of a first embodiment of the present invention is that a ruthenium (Ru) seed layer is previously formed using a plasma enhanced chemical vapor deposition (PECVD) process before a ruthenium thin film is deposited using a thermal chemical vapor deposition (CVD). Like a typical metal growth mechanism, since the ruthenium thin film grows in an island type at a growth mechanism, an incubation layer approximately 200 Å or more thick is needed in order to obtain a uniform ruthenium thin film. In case where the ruthenium seed layer is formed using the PECVD process, however, even if the ruthenium seed layer is approximately 100 Å to 150 Å thick, the ruthenium seed layer can sufficiently act as the incubation layer. Accordingly, it is possible to ultimately obtain the ruthenium thin film that is thinner, more uniform and even.

Figure 1:
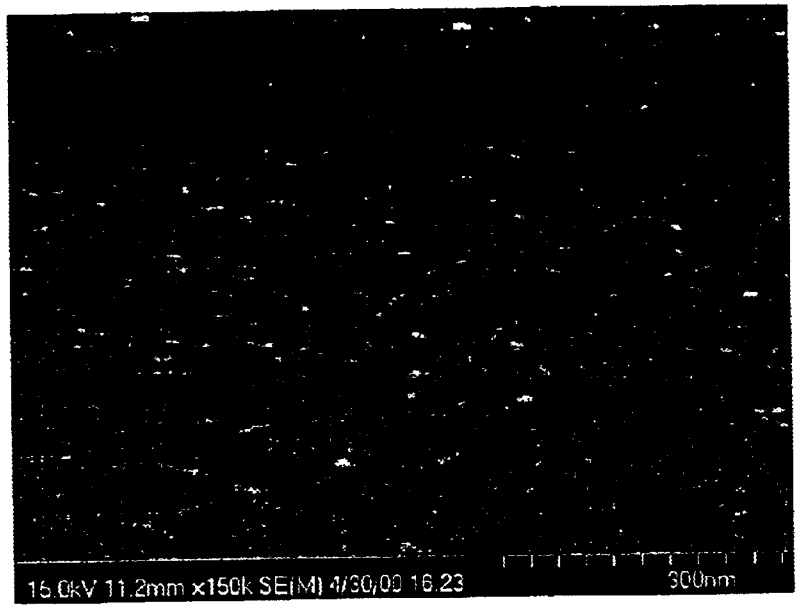
FIGS. 1 to 3 are SEM photographs of a conventional ruthenium thin film.
Figure 2:
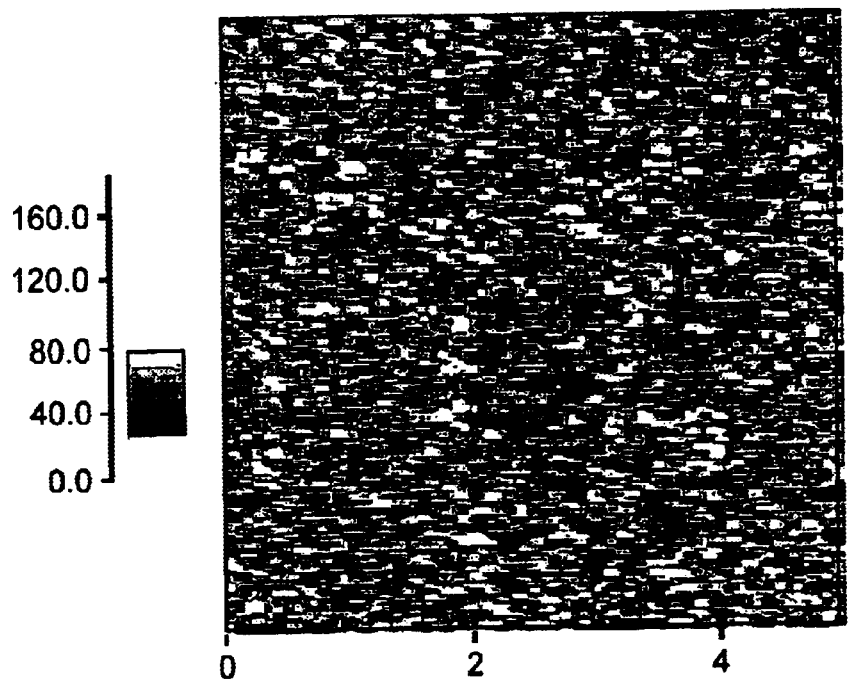
Figure 3:
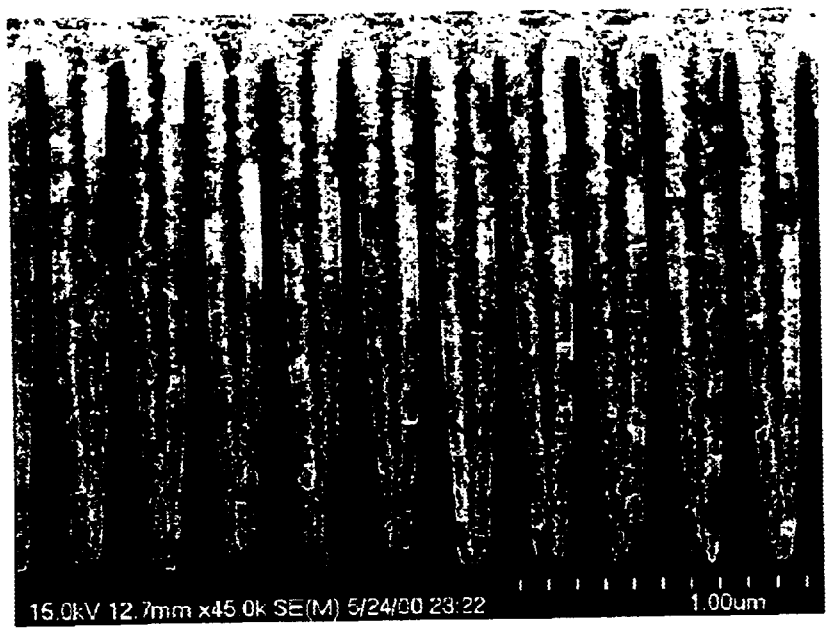
Figure 4:
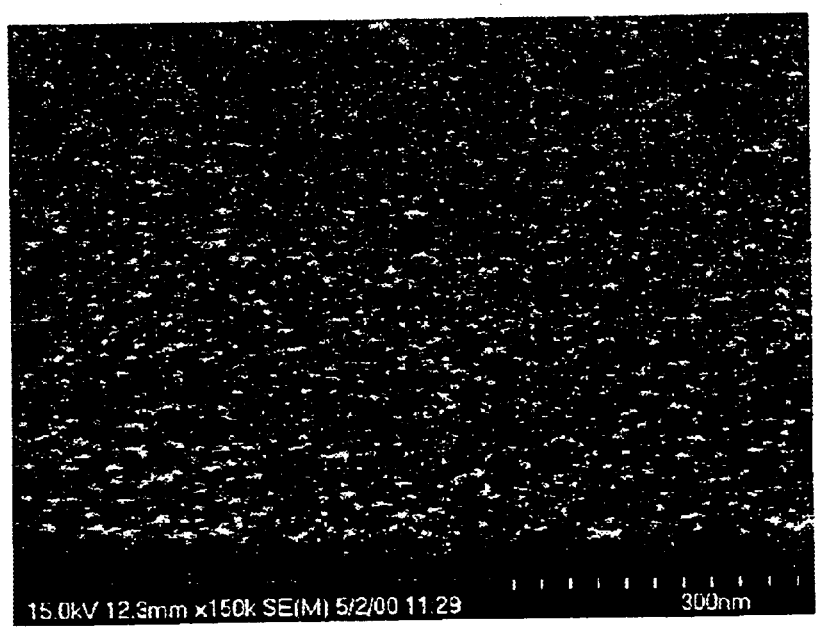
FIGS. 4 to 9 are SEM photographs of a ruthenium thin film formed using a thin film forming method in accordance with the present invention.
Figure 5:
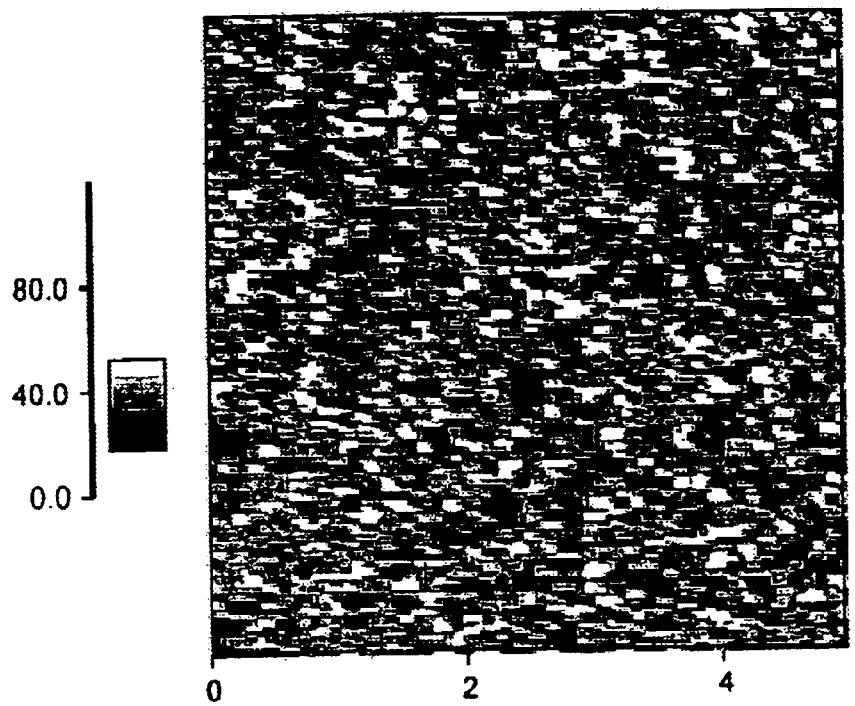

FIGS. 4 and 5 are a SEM photograph and an AFM photograph of a surface of the ruthenium seed layer formed using the PECVD process, respectively. An Ru(OD)3, one of metal-organic materials, is used as a ruthenium source, and an oxygen ($O_2$) gas, an argon (Ar) gas and an evaporated ruthenium source are supplied into a reaction chamber while maintaining a ratio of $O_2$ to ($O_2$+Ar) at a range of 0.1 to 0.5. A substrate temperature is 260□ to 280□ and a power applied to the plasma is 0.5 W/cm$^2$ to 1.5 W/cm$^2$. As shown in FIGS. 4 and 5, it can be seen that the ruthenium seed layer is a uniform layer formed of high-density surface granules.

In addition, an AFM analysis shows that the ruthenium seed layer has an excellent surface roughness (rms) of approximately 1.35 nm.

Figure 6:
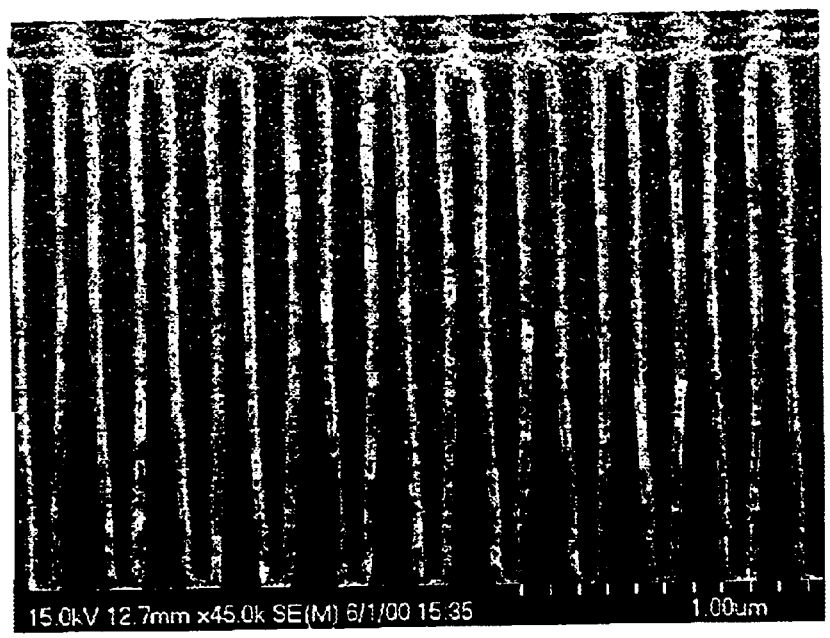

In case where the ruthenium thin film is formed using only the PECVD process, however, the step coverage becomes degraded. Therefore, only the ruthenium seed layer is formed using the PECVD process and then the ruthenium thin film is deposited using a thermal CVD process. FIG. 6 is a SEM photograph of the resulting structure. The deposition of the ruthenium thin film using the thermal CVD process is carried out supplying the oxygen gas, the argon gas and the evaporated ruthenium source. At this time, it is desirable that a ratio of $O_2$ to ($O_2$+Ar) be maintained at a range of 0.1 to 0.5. As can be seen from FIG. 6, the step coverage becomes very excellent.

The ruthenium thin film can be used as a bottom electrode of a capacitor by forming the ruthenium thin film on a polycrystalline silicon layer, and a TiN layer acting as a diffusion preventing layer can be interposed between the ruthenium thin film and the bottom electrode. Further, the ruthenium thin film can be used as a top electrode of the capacitor by being formed on a $Ta_2O_5$ layer, a PZT layer or a BST layer. In some cases, the ruthenium thin film can be also formed on a $SiO_2$ layer.

Figure 7:
Figure 8:
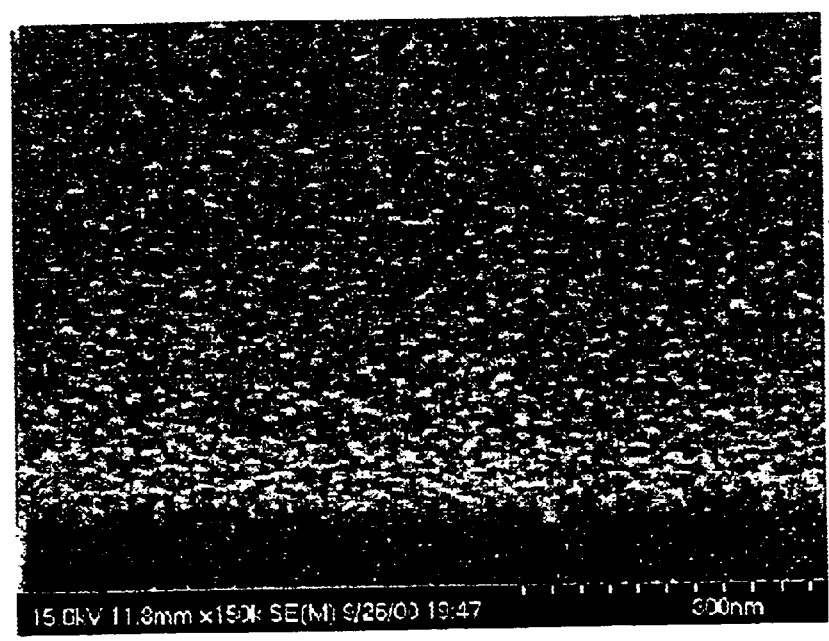
Figure 9:
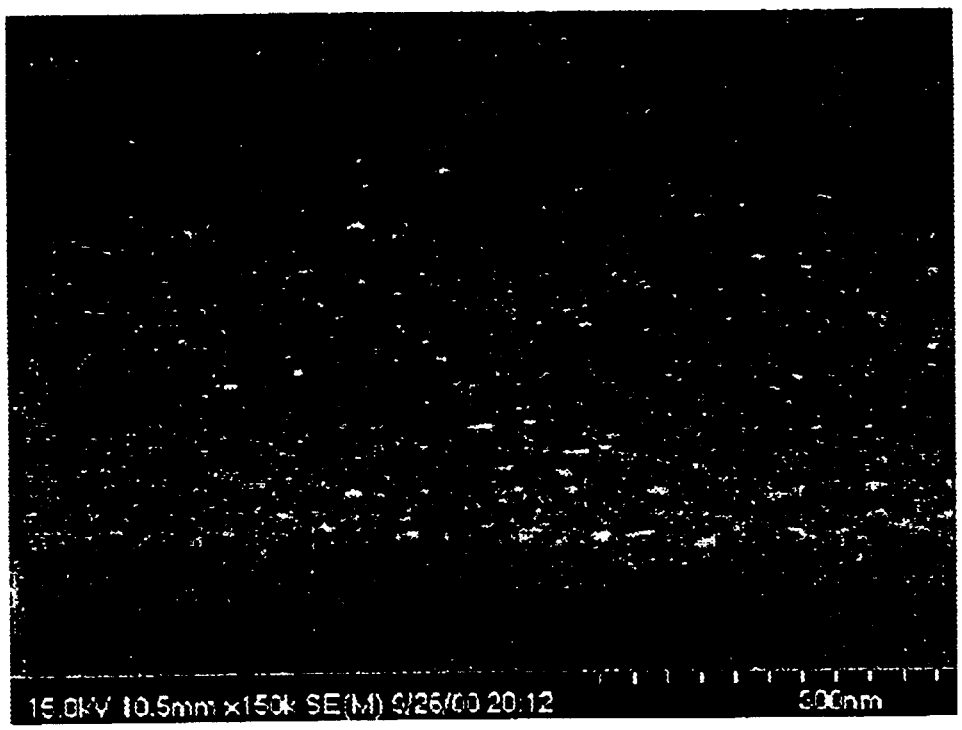

FIG. 7 is a SEM photograph of the surface of the ruthenium thin film formed on an MOCVD-TIN layer using the thermal CVD process, and FIG. 8 is a SEM photograph of the surface of the ruthenium thin film formed on the MOCVD-TIN layer using the PECVD process. FIG. 9 is a SEM photograph in case where the ruthenium seed layer and the ruthenium thin film are sequentially formed on the MOCVD-TiN layer respectively using the PECVD process and the thermal CVD process. In comparison with FIG. 7, FIGS. 8 and 9 show that the ruthenium thin film has a very smooth surface. In case-where, like FIG. 8, the ruthenium thin film is formed using only the PECVD process, the step coverage is degraded, so that the case of FIG. 9 is the most desirable.

Meanwhile, there is a concern about a lowering of an electric conductivity due to a formation of $RuO_x$ within the ruthenium thin film. Therefore, in order to remove an oxygen gas that may remain within the ruthenium thin film, it is desirable that the surface of the ruthenium thin film deposited by the thermal CVD process be processed using an $NH_3$ containing plasma.

[Embodiment 2]

A significant characteristic of a second embodiment of the present invention is that the ruthenium thin film is first deposited on the semiconductor substrate and then a surface of the ruthenium thin film is processed using an oxygen containing plasma. In order to remove an oxygen gas that may remain within the ruthenium thin film after the process of the oxygen containing plasma, it is desirable that the surface of the ruthenium thin film be again processed using an $NH_3$ containing plasma.

[Embodiment 3]

Unlike the second embodiment of the present invention in which the ruthenium source is not supplied during the process of the oxygen containing plasma, a characteristic of the third embodiment of the present invention is that the plasma process is carried out supplying the ruthenium source as well as the oxygen component. In other words, the third embodiment of the present invention is characterized in that the ruthenium thin film is formed on the semiconductor substrate using the thermal CVD process and then another ruthenium thin film is further formed on the resulting structure using the PECVD process, resulting in a decrease of the surface morphology. In case where the ruthenium thin film is formed using the PECVD process, processing conditions of the third embodiment are equal to those of the first embodiment. In this case, in order to remove an oxygen gas that may remain within the ruthenium thin film after the process of depositing the ruthenium thin film using the PECVD process, it is desirable that the surface of the Ru thin film be again processed using an $NH_3$ containing plasma.

As described above, as one method of forming the ruthenium thin film, the ruthenium seed layer is first formed using the PECVD process and then the ruthenium thin film is deposited using the thermal CVD process. As another method, a first ruthenium thin film is deposited using the thermal CVD process and then a second ruthenium thin film is formed on the first ruthenium thin film using the PECVD process. As further another method, the ruthenium thin film is deposited using the thermal CVD process and then the surface of the ruthenium thin film is processed using the oxygen containing plasma. According to these methods, both the surface morphology and the step coverage can be improved.

While the present invention has been described in detail, it should be understood that various changes, substitutions and alterations could be made hereto without departing from the spirit and scope of the invention as defined by the appended claims.

What is claimed is:

1. A method of forming a ruthenium (Ru) thin film, the method comprising the steps of:
   a) forming a ruthenium seed layer on a semiconductor substrate using a PECVD process; and
   b) forming a ruthenium thin film on the ruthenium seed layer using a thermal CVD process.

2. The method of claim 1, wherein the ruthenium seed layer has a thickness of 100 Å to 150 Å.

3. The method of claim 1, wherein a ruthenium source used in the steps a) and b) is Ru(OD)3.

4. The method of claim 1, wherein the step of forming the ruthenium seed layer is carried out by supplying an oxygen ($O_2$) gas, an argon (Ar) gas and an evaporated ruthenium source, at a ratio of $O_2$ to ($O_2$+Ar) at a range of 0.1 to 0.5.

5. The method of claim 1, wherein the step of forming the ruthenium thin film is carried out by supplying an oxygen ($O_2$) gas and an argon (Ar) gas and an evaporated ruthenium source, at a ratio of $O_2$ to ($O_2$+Ar) at a range of 0.1 to 0.5.

6. The method of claim 1, wherein a substrate temperature at the step a) is 260° C. to 280° C.

7. The method of claim 1, wherein a power applied to the plasma at the step a) is 0.5 $W/cm^2$ to 1.5 $W/cm^2$.

8. The method of claim 1, wherein one selected from the group consisting of a TiN layer, a polycrystalline silicon layer, a $SiO_2$ layer, a $Ta_2O_5$ layer, a PZT layer and a BST layer is formed on the semiconductor substrate, the ruthenium seed layer being formed on one selected from the group consisting of the TiN layer, the polycrystalline silicon layer, the $SiO_2$ layer, the $Ta_2O_5$ layer, the PZT layer and the BST layer.

9. The method of claim 1, further comprising the step of processing a surface of the ruthenium thin film using an $NH_3$ containing plasma.

10. A method of forming a ruthenium thin film, the method comprising the steps of:
   a) forming a ruthenium thin film on a semiconductor substrate using a thermal CVD process;
   b) processing a surface of the ruthenium thin film using an oxygen containing plasma; and
   c) processing the surface of the ruthenium thin film using an $NH_3$ containing plasma.

11. The method of 10, wherein one selected from the group consisting of a TiN layer, a polycrystalline silicon layer, a $SiO_2$ layer, a $Ta_2O_5$ layer, a PZT layer and a BST layer is formed on the semiconductor substrate, the ruthenium seed layer being formed on one selected from the group consisting of the TiN layer, the polycrystalline silicon layer, the $SiO_2$ layer, the $Ta_2O_5$ layer, the PZT layer and the BST layer.

12. A method of forming a ruthenium thin film, the method comprising the steps of:

a) forming a first ruthenium thin film on a semiconductor substrate using a thermal CVD process; and b) forming a second ruthenium thin film on the first ruthenium thin film using a PECVD process.

13. The method of claim 12, wherein the second ruthenium thin film has a thickness of 100 Å to 150 Å.

14. The method of claim 12, wherein a ruthenium source used in the steps a) and b) is Ru(OD)3.m.

15. The method of claim 12, wherein the step of forming the first ruthenium thin film is carried out by supplying an oxygen ($O_2$) gas, an argon (Ar) gas and an evaporated ruthenium source at a ratio of $O_2$ to ($O_2$+Ar) at a range of 0.1 to 0.5.

16. The method of claim 12, wherein the step of forming the second ruthenium thin film is carried out by supplying an oxygen ($O_2$) gas, an argon (Ar) gas and an evaporated ruthenium source at a ratio of $O_2$ to ($O_2$+Ar) of at a range 0.1 to 0.5.

17. The method of claim 12, wherein a substrate temperature at the step b) is 260° C. to 280° C.

18. The method of claim 12, wherein a power applied to the plasma at the step b) is 0.5 $W/cm^2$ to 1.5 $W/cm^2$.

19. The method of claim 12, wherein one selected from the group consisting of a TiN layer, a polycrystalline silicon layer, a $SiO_2$ layer, a $Ta_2O_5$ layer, a PZT layer and a BST layer is formed on the semiconductor substrate, the ruthenium seed layer being formed on one selected from the group consisting of the TiN layer, the polycrystalline silicon layer, the $SiO_2$ layer, the $Ta_2O_5$ layer, the PZT layer and the BST layer.

20. The method of claim 12, further comprising the step of processing a surface of the second ruthenium thin film using an $NH_3$ containing plasma.

* * * * *